United States Patent
Mittelholzer

(10) Patent No.: US 7,786,906 B2
(45) Date of Patent: *Aug. 31, 2010

(54) MODULATION CODING AND DECODING

(75) Inventor: Thomas Mittelholzer, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/262,297

(22) Filed: Oct. 31, 2008

(65) Prior Publication Data

US 2009/0115647 A1 May 7, 2009

(30) Foreign Application Priority Data

Nov. 7, 2007 (EP) ................... 07120162

(51) Int. Cl.
*H03M 7/00* (2006.01)

(52) U.S. Cl. .......................... 341/80; 341/81

(58) Field of Classification Search ............. 341/58, 341/59, 60, 80, 81; 360/40; 369/59.23
See application file for complete search history.

(56) References Cited

U.S. PATENT DOCUMENTS

| | | | | |
|---|---|---|---|---|
| 3,718,863 | A * | 2/1973 | Fletcher et al. ............. | 377/67 |
| 5,760,718 | A | 6/1998 | Schouhamer Immink | |
| 7,064,687 | B1 * | 6/2006 | Blaum et al. ............. | 341/80 |
| 7,071,851 | B1 | 7/2006 | Blaum et al. | |
| 7,126,502 | B2 | 10/2006 | Blaum et al. | |
| 2009/0115648 | A1 * | 5/2009 | Mittelholzer ............. | 341/80 |

OTHER PUBLICATIONS

William H. Kautz; "Fibonacci Codes for Synchronization Control," IEEE Transactions on Information Theory, vol. 11, Apr. 1965, pp. 284-292.
Thomas M. Cover; "Enumerative Source Encoding;" IEEE Transactions on Information Theory, vol. 17-19, No. 1, Jan. 1973, pp. 73-77.

* cited by examiner

*Primary Examiner*—Brian Young
(74) *Attorney, Agent, or Firm*—Cantor Colburn LLP

(57) ABSTRACT

Methods and apparatus are provided for modulation coding a stream of binary input data. A 4-ary enumerative encoding algorithm is applied to the input bit-stream to produce a succession of 4-ary output symbols. The 4-ary algorithm is operative to simultaneously encode respective generalized Fibonacci codes in the odd and even interleaves of the input bit-stream. The bits of each successive 4-ary output symbol are then interleaved, producing an output bit-stream which has global and interleaved run-length constraints. Inverting the bits of the 4-ary output symbols produces an output bit-stream with (G, I)-constraints as in the PRML (G, I) codes used in reverse-concatenation modulation systems. Corresponding decoding systems are also provided.

25 Claims, 5 Drawing Sheets

Input u u= 0=[0 0 0 0 0]
u= 1=[0 0 0 0 1]
u= 2=[0 0 0 1 0]
u= 3=[0 0 0 1 1]
u= 4=[0 0 1 0 0]
...
u=30=[1 1 1 1 0]
u=31=[1 1 1 1 1]

Encoding rule
(successive subtraction of bases from input)

For i=1 to N {
  if u ≥ $w_{N-i+1}$ then $x_i$=1
                     u=u−$w_{N-i+1}$
  else $x_i$=0
}

((31−21) − 8) − 2
((u − $w_7$) − $w_5$)−$w_2$

Output =
[$x_1, x_2, \ldots, x_7$]

$w_7, w_6, \ldots, w_1$
x=[0 0 0 0 0 0 0]
x=[0 0 0 0 0 0 1]
x=[0 0 0 0 0 1 0]
x=[0 0 0 0 1 0 0]
x=[0 0 0 0 1 0 1]
...
x=[1 0 1 0 0 0 1]
x=[1 0 1 0 0 1 0]

Figure 1

| | Add/Subtractions of (L+1)-bit numbers | Comparisons of (L+1)-bit numbers | Add./subtractions of (2L+2)-bit numbers | Comparisons of (2L+2)-bit numbers | Multiplications of (L+1)-bit numbers |
|---|---|---|---|---|---|
| Per iteration | 7 | 4 | 2 | 3 | 3 |

Figure 5

| n | 100 | 99 | 98 | 97 | 96 | 95 | 94 | 93 | 92 | 91 | 90 | 89 | 88 | 87 | 86 | 85 | 84 | 83 | 82 | 81 |
|---|---|---|---|---|---|---|---|---|---|---|---|---|---|---|---|---|---|---|---|---|
| $B_n 2^9$ | 209 | 211 | 213 | 215 | 217 | 219 | 221 | 223 | 225 | 227 | 229 | 231 | 233 | 235 | 237 | 239 | 241 | 243 | 245 | 247 |
| j(n) | 2 | 5 | 5 | 5 | 5 | 5 | 5 | 5 | 5 | 5 | 5 | 5 | 5 | 5 | 5 | 5 | 5 | 5 | 5 | 5 |

| n | 80 | 79 | 78 | 77 | 76 | 75 | 74 | 73 | 72 | 71 | 70 | 69 | 68 | 67 | 66 | 65 | 64 | 63 | 62 | 61 |
|---|---|---|---|---|---|---|---|---|---|---|---|---|---|---|---|---|---|---|---|---|
| $B_n 2^9$ | 249 | 251 | 254 | 256 | 258 | 261 | 263 | 266 | 268 | 271 | 273 | 276 | 278 | 281 | 283 | 286 | 289 | 291 | 294 | 297 |
| j(n) | 5 | 5 | 5 | 5 | 5 | 5 | 5 | 5 | 5 | 5 | 5 | 5 | 5 | 5 | 5 | 5 | 5 | 5 | 5 | 5 |

| n | 60 | 59 | 58 | 57 | 56 | 55 | 54 | 53 | 52 | 51 | 50 | 49 | 48 | 47 | 46 | 45 | 44 | 43 | 42 | 41 |
|---|---|---|---|---|---|---|---|---|---|---|---|---|---|---|---|---|---|---|---|---|
| $B_n 2^9$ | 299 | 302 | 305 | 308 | 311 | 314 | 317 | 320 | 323 | 326 | 329 | 332 | 335 | 338 | 341 | 344 | 347 | 350 | 353 | 356 |
| j(n) | 5 | 5 | 5 | 5 | 5 | 5 | 5 | 5 | 5 | 5 | 5 | 5 | 5 | 5 | 5 | 5 | 5 | 5 | 5 | 5 |

| n | 40 | 39 | 38 | 37 | 36 | 35 | 34 | 33 | 32 | 31 | 30 | 29 | 28 | 27 | 26 | 25 | 24 | 23 | 22 | 21 |
|---|---|---|---|---|---|---|---|---|---|---|---|---|---|---|---|---|---|---|---|---|
| $B_n 2^9$ | 359 | 362 | 365 | 368 | 371 | 375 | 378 | 381 | 385 | 388 | 392 | 395 | 399 | 402 | 406 | 409 | 413 | 417 | 420 | 424 |
| j(n) | 5 | 5 | 5 | 5 | 5 | 5 | 5 | 5 | 5 | 5 | 5 | 5 | 5 | 5 | 5 | 5 | 5 | 5 | 5 | 5 |

| n | 20 | 19 | 18 | 17 | 16 | 15 | 14 | 13 | 12 | 11 | 10 | 9 | 8 | 7 | 6 | 5 | 4 | 3 | 2 | 1 |
|---|---|---|---|---|---|---|---|---|---|---|---|---|---|---|---|---|---|---|---|---|
| $B_n 2^9$ | 428 | 432 | 436 | 440 | 444 | 448 | 452 | 456 | 460 | 464 | 468 | 472 | 476 | 480 | 480 | 480 | 512 | 512 | 512 | 512 |
| j(n) | 5 | 5 | 5 | 5 | 5 | 5 | 5 | 5 | 5 | 5 | 5 | 5 | 5 | 5 | 5 | 4 | 3 | 3 | 2 | 1 |

Figure 6

| | | | | | | | | | | | | | | | | | | | | |
|---|---|---|---|---|---|---|---|---|---|---|---|---|---|---|---|---|---|---|---|---|
| n | 200 | 199 | 198 | 197 | 196 | 195 | 194 | 193 | 192 | 191 | 190 | 189 | 188 | 187 | 186 | 185 | 184 | 183 | 182 | 181 |
| $B_n 2^9$ | 194 | 195 | 196 | 197 | 198 | 199 | 200 | 201 | 202 | 203 | 204 | 205 | 206 | 207 | 208 | 209 | 210 | 211 | 212 | 213 |
| n | 180 | 179 | 178 | 177 | 176 | 175 | 174 | 173 | 172 | 171 | 170 | 169 | 168 | 167 | 166 | 165 | 164 | 163 | 162 | 161 |
| $B_n 2^9$ | 214 | 215 | 216 | 217 | 218 | 219 | 220 | 221 | 222 | 223 | 224 | 225 | 226 | 227 | 228 | 229 | 230 | 231 | 232 | 233 |
| n | 160 | 159 | 158 | 157 | 156 | 155 | 154 | 153 | 152 | 151 | 150 | 149 | 148 | 147 | 146 | 145 | 144 | 143 | 142 | 141 |
| $B_n 2^9$ | 234 | 235 | 236 | 237 | 238 | 239 | 240 | 241 | 242 | 243 | 244 | 245 | 246 | 247 | 248 | 249 | 250 | 252 | 253 | 254 |
| n | 140 | 139 | 138 | 137 | 136 | 135 | 134 | 133 | 132 | 131 | 130 | 129 | 128 | 127 | 126 | 125 | 124 | 123 | 122 | 121 |
| $B_n 2^9$ | 255 | 256 | 258 | 259 | 260 | 261 | 263 | 264 | 265 | 266 | 268 | 269 | 270 | 272 | 273 | 274 | 276 | 277 | 278 | 280 |
| n | 120 | 119 | 118 | 117 | 116 | 115 | 114 | 113 | 112 | 111 | 110 | 109 | 108 | 107 | 106 | 105 | 104 | 103 | 102 | 101 |
| $B_n 2^9$ | 281 | 282 | 284 | 285 | 286 | 288 | 289 | 291 | 292 | 294 | 295 | 297 | 298 | 300 | 301 | 303 | 304 | 306 | 307 | 309 |
| n | 100 | 99 | 98 | 97 | 96 | 95 | 94 | 93 | 92 | 91 | 90 | 89 | 88 | 87 | 86 | 85 | 84 | 83 | 82 | 81 |
| $B_n 2^9$ | 310 | 312 | 313 | 315 | 316 | 318 | 319 | 321 | 322 | 324 | 325 | 327 | 328 | 330 | 331 | 333 | 334 | 336 | 338 | 339 |
| n | 80 | 79 | 78 | 77 | 76 | 75 | 74 | 73 | 72 | 71 | 70 | 69 | 68 | 67 | 66 | 65 | 64 | 63 | 62 | 61 |
| $B_n 2^9$ | 341 | 343 | 344 | 346 | 348 | 349 | 351 | 353 | 354 | 356 | 358 | 360 | 361 | 363 | 365 | 367 | 368 | 370 | 372 | 374 |
| n | 60 | 59 | 58 | 57 | 56 | 55 | 54 | 53 | 52 | 51 | 50 | 49 | 48 | 47 | 46 | 45 | 44 | 43 | 42 | 41 |
| $B_n 2^9$ | 376 | 378 | 380 | 382 | 384 | 386 | 388 | 390 | 392 | 394 | 396 | 398 | 400 | 402 | 404 | 406 | 408 | 410 | 412 | 414 |
| n | 40 | 39 | 38 | 37 | 36 | 35 | 34 | 33 | 32 | 31 | 30 | 29 | 28 | 27 | 26 | 25 | 24 | 23 | 22 | 21 |
| $B_n 2^9$ | 416 | 418 | 420 | 422 | 424 | 426 | 428 | 430 | 432 | 434 | 436 | 438 | 440 | 442 | 444 | 446 | 448 | 450 | 452 | 454 |
| n | 20 | 19 | 18 | 17 | 16 | 15 | 14 | 13 | 12 | 11 | 10 | 9 | 8 | 7 | 6 | 5 | 4 | 3 | 2 | 1 |
| $B_n 2^9$ | 456 | 458 | 460 | 462 | 464 | 466 | 468 | 470 | 472 | 474 | 476 | 478 | 480 | 480 | 480 | 480 | 512 | 512 | 512 | 512 |

Figure 7

|  | PRML(10,5) | PRML(12,6) | PRML(14,7) |
|---|---|---|---|
| Rate | 197/200=0.985 | 397/400=0.9925 | 235/236=0.9958 |
| Constraints after 8-bit symbol insertion | I=9<br>G=18 | I=10<br>G=20 | I=11<br>G=22 |
| Minimum spacing of insertion locations | 12 [bits] | 14 [bits] | 16 [bits] |

Figure 8

MODULATION CODING AND DECODING

This application claims priority to European Patent Application No. 07120162.8, filed 7 Nov. 2007, and all the benefits accruing therefrom under 35 U.S.C. §119, the contents of which in its entirety are herein incorporated by reference.

BACKGROUND

This invention relates generally to methods and apparatus for modulation coding input data and to corresponding modulation decoding systems.

Modulation codes are employed in data storage systems to eliminate undesirable bit-sequences in the recording data, for example bit sequences which give rise to errors in the reproduction process. One example of an undesirable bit-sequence is a long run of bits of the same value. Another example is a long run of bits of the same value in alternating positions in the bit stream, i.e. in either the odd (O) or even (E) interleave of a bit stream ... EOEOEO .... For instance, a long sequence of the form 0a0b0c0d0 ..., where a, b, c, etc. can be either 0 or 1, would be generally undesirable. Modulation codes impose some form of constraint on the occurrence of undesirable bit-sequences in the encoded bit-stream. For example, some modulation codes impose a so-called j-constraint, whereby the maximum length of a run of consecutive 1's in the encoded bit-stream is limited to the predetermined value j. Other modulation codes impose a constraint on the maximum run-length of consecutive 0's. This is referred to as a k- or G-constraint, whereby the maximum run-length of consecutive 0's is limited to the value k or G respectively. An example of the latter code-type is provided by the PRML (G, I) codes used in PRML (partial-response maximum likelihood) based recording systems such as tape drives and optical storage systems. In addition to the "global" or G-constraint, these codes impose an "interleave" or I-constraint. This limits the maximum run-length of 0's in each of the odd and even interleaves to the value I. An I-constrained bit-stream is of course necessarily G-constrained with G=2I.

PRML (G, I)-codes are particularly useful for reverse concatenation (RC) modulation schemes, where the modulation coding is performed prior to error-correction coding (ECC). Error propagation is reduced in RC schemes because the ECC decoder operates before the modulation decoder on reproduction. That is, if the ECC decoder makes no errors, there is no error propagation through the modulation decoder. Thus, RC allows the use of long modulation codes (i.e. codes with long codeword lengths), facilitating the design of high-rate codes and encoders which operate close to the capacity of the selected constraint. To be useful, however, these codes need to have a practical implementation based on efficient encoding and decoding algorithms.

A practical encoder for imposing a k-constraint in the encoded bit-stream is disclosed in U.S. Pat. No. 5,760,718. This implements an enumerative encoding technique based on the class of generalized Fibonacci codes. Enumerative encoding is discussed in "Enumerative Source Encoding", T. M. Cover, IEEE Trans. Inform. Theory, Vol. 19, pp. 73-77, January 1973. Fibonacci codes are discussed in "Fibonacci Codes for Synchronisation Control", W. H. Kautz, IEEE Trans. Inform. Theory, Vol. 11, pp. 284-292, April 1965. While reference is made to the foregoing papers for a detailed discussion, it is useful here to give a brief explanation of these techniques to assist understanding of the invention to be described.

In simple terms, enumerative encoding is a process of mapping input words to output codewords based on lexicographic ordering of the codewords. That is, if a set of X binary codewords are ordered according to binary value, then each codeword can be assigned a number from 1 to X according to its position in the ordered set. If each of these assigned numbers 1 to X then defines the value of a binary input word, each of the X binary input words is associated with a corresponding codeword. Enumerative encoding is the process of mapping input words to output codewords in accordance with this type of scheme. While the underlying encoding principle is simple enough, the problem in practice lies in designing an efficient encoder for generating the codewords from the binary input words. If there are $2^{100}$ codewords for example, then the need for an efficient encoder design is readily apparent.

Fibonacci codes are characterised by a set of weights, also called bases, which define the value of a binary 1 at respective positions in a binary codeword representation. That is, a 1 at a given position in a binary codeword represents the value of the Fibonacci base for that position rather than the usual power of two. As a simple example, consider a Fibonacci code defined by a set of N=7 bases given by $\{w_n\}$=1, 2, 3, 5, 8, 13, 21. It can be seen that the bases satisfy the linear recursion $$w_{n+1}=w_n+w_{n-1} \text{ for } n=2, 3, \ldots, 6$$

The complete set of (N=7)-bit Fibonacci codewords can represent $w_{N+1}$=(13+21)=34 possible values. Since $34 \geq 2^5$, this simple Fibonacci code can encode 5-bit inputs into codewords of length N=7 by an enumerative encoding process. This encoding process is defined by $$u=\Sigma x_i w_{N-i+1} \text{ for } i=1 \text{ to } 7$$

where u is the input word value and $(x_1, x_2, \ldots, x_7)$ is the output codeword. The encoding process is performed by successive subtraction of the Fibonacci bases from the input word value as illustrated in FIG. 1 of the accompanying drawings. In particular, the number u is successively reduced by whichever of the bases $w_n$, taken in decreasing value order, does not give a negative result. If a given weight $w_{N-i+1}$ is actually subtracted from the running difference, then $x_i$=1. Otherwise $x_i$=0.

Consideration of FIG. 1 demonstrates that this simple Fibonacci code imposes a j=1 constraint, i.e. no more than one consecutive 1's can occur in a codeword. With generalized Fibonacci codes, the bases $w_n$ for n=1 to N satisfy the following linear recursion (inequality)

$$w_{n+1} \leq w_n+w_{n-1}+\ldots+w_{n-j} \text{ for } n=j+1, j+2, \ldots, N-1$$

where the specified positive integer j defines the j-constraint of the code. The maximum number of codewords in such a generalized Fibonacci code is given by $$w_{N+1}=w_N+w_{N-1}+\ldots+w_{N-j}.$$

As with the simple code of FIG. 1, a binary codeword $(x_1, x_2, \ldots, x_N)$ in the generalized Fibonacci code is obtained by representing an input u, $0 \leq u < w_{N+1}$, by the bases $\{w_n\}$, i.e.

$$u=\Sigma x_i w_{N-i+1}.$$

For implementation purposes, as described in U.S. Pat. No. 5,760,718 referenced above, the bases are chosen to have a limited span L, i.e.

$$w_n=B_n 2^{n-1}$$

where $B_n$ is in the range $2^{-1} \leq B_n \leq 1$ and has an L-bit representation. With bases of span L, encoding can be performed in a sliding window fashion, using an (L+1)-bit wide window which runs from the most significant bits of $\Sigma\, u_k 2^k$ to the least significant bits.

Based on similar enumerative encoding ideas to those of U.S. Pat. No. 5,760,718, U.S. Pat. Nos. 7,064,687 and 7,071,851 disclose encoders and decoders designed for PRML (G, I) codes. These are derived from generalized Fibonacci codes. In particular, an input bit-stream is separated into its odd and even interleaves, and the two interleaves are then encoded by separate Fibonacci encoders. Since Fibonacci codes impose a j-constraint on runs of 1's, bit inversion of the encoder outputs results in two encoded bit streams each with a constraint on runs of 0's. A multiplexer then interleaves the encoded bit streams to give a single, (G, I)-constrained output bit-stream with G=2I, where I equals the value of j for the original Fibonacci code. In the modulation encoder of U.S. Pat. No. 7,064,687, a short block encoder is required to encode a subset of the input data bits prior to separation of the odd and even interleaves. This imposes an initial constraint on the input bit-stream to limit the possible inputs to the two Fibonacci encoders. While this offers a practical implementation, the need for efficient Boolean logic for the short block code makes it difficult to achieve very high rates for the resulting PRML (G, I) code.

SUMMARY

A first aspect of the present invention provides a method for modulation coding a stream of binary input data. The method comprises:

applying a 4-ary enumerative encoding algorithm to the input bit-stream to produce a succession of 4-ary output symbols, the 4-ary algorithm being operative to simultaneously encode respective generalized Fibonacci codes in the odd and even interleaves of the input bit-stream; and interleaving bits of each successive 4-ary output symbol to produce an output bit-stream.

A second aspect of the invention provides a method for decoding an output bit-stream produced by a modulation coding method according to the first aspect of the invention. The decoding method comprises:

de-interleaving bits of the output bit stream to produce a succession of 4-ary symbols; and applying a 4-ary enumerative decoding algorithm to the 4-ary symbols to simultaneously decode said generalized Fibonacci codes applied to said odd and even interleaves by said 4-ary encoding algorithm, thereby to recover said stream of binary input data.

A third aspect of the invention provides apparatus for modulation coding a stream of binary input data. The modulation coding apparatus comprises:

a 4-ary encoder for applying a 4-ary enumerative encoding algorithm to the input bit-stream to produce a succession of 4-ary output symbols, the 4-ary algorithm being operative to simultaneously encode respective generalized Fibonacci codes in the odd and even interleaves of the input bit-stream; and a multiplexer for interleaving bits of each successive 4-ary output symbol to produce an output bit-stream.

A fourth aspect of the invention provides apparatus for decoding an output bit-stream produced by modulation coding apparatus according to the third aspect of the invention. The decoding apparatus comprises:

a demultiplexer for de-interleaving bits of the output bit stream to produce a succession of 4-ary symbols; and a 4-ary decoder for applying a 4-ary enumerative decoding algorithm to the 4-ary symbols to simultaneously decode said generalized Fibonacci codes applied to said odd and even interleaves by said 4-ary encoding algorithm, thereby to recover said stream of binary input data.

A fifth aspect of the invention provides a data storage system comprising:

modulation coding apparatus according to the third aspect of the invention for modulation coding a stream of binary input data comprising a succession of M-bit words to produce an output bit-stream comprising a succession of 2N-bit codewords;

a recording channel comprising a storage medium and a recording/reproduction mechanism for recording the succession of codewords on the storage medium and for reading the storage medium to generate a reproduced signal;

detector apparatus for detecting a succession of 2N-bit words in the reproduced signal;

a demultiplexer for de-interleaving bits of the detected 2N-bit words to produce a succession of 4-ary symbols; and a 4-ary decoder for applying a 4-ary enumerative decoding algorithm to the 4-ary symbols of each 2N-bit word to simultaneously decode said generalized Fibonacci codes applied to said odd and even interleaves by said 4-ary encoding algorithm, thereby to produce a succession of M-bit data words.

In such data storage systems, the succession of 2N-bit codewords produced in the modulation apparatus will typically undergo various further processing steps, such as precoding and ECC coding in the case of PRML systems, prior to being recorded in the channel. In preferred embodiments, PRML (G, I) codes are employed in a reverse concatenation modulation scheme, whereby the data storage system includes a precoder for $1/(1+D^2)$ coding the output bit-stream from the modulation coding apparatus to produce a precoded bit-stream, and an ECC coder for error-correction coding the precoded bit-stream to produce an ECC-coded bit-stream for supply to the recording channel. The detector apparatus then includes an ECC decoder for correcting errors in the 2N-bit words detected in the reproduced signal.

Systems can of course be envisaged which permit reading of a recording medium but not writing to the medium, an example being a read-only CD or DVD player. Such systems may thus employ decoding apparatus embodying the invention without having the corresponding encoding apparatus. In particular, a sixth aspect of the invention provides a data reproduction system for reproducing data recorded on a storage medium by a recording system implementing a modulation coding method according to the first aspect of the invention. The data reproduction system comprises:

a read mechanism for reading the storage medium to generate a reproduced signal;

detector apparatus for detecting a succession of 2N-bit words in the reproduced signal;

a demultiplexer for de-interleaving bits of the detected 2N-bit words to produce a succession of 4-ary symbols; and a 4-ary decoder for applying a 4-ary enumerative decoding algorithm to the 4-ary symbols of each 2N-bit word to simultaneously decode said generalized Fibonacci codes applied to said odd and even interleaves by the 4-ary encoding algorithm of said modulation coding method, thereby to produce a succession of M-bit data words.

In general, where features are described herein with reference to embodiments of one aspect of the invention, corresponding features may be provided in embodiments of another aspect of the invention.

BRIEF DESCRIPTION OF THE DRAWINGS

Preferred embodiments of the invention will now be described, by way of example, with reference to the accompanying drawings in which:

FIG. 1 illustrates an encoding process using a simple Fibonacci code;

FIG. 5 gives a breakdown of processing steps performed in operation of the encoding algorithm implemented by the modulation encoder of FIG. 3;

FIGS. 6 and 7 tabulate the bases of respective Fibonacci codes employed in embodiments of the modulation encoder of FIG. 3; and FIG. 8 compares three PRML (G, I) codes employed in embodiments of the modulation encoder.

DETAILED DESCRIPTION

As described earlier, in the prior art techniques two separate binary encoding algorithms operate independently on the separated odd and even interleaves of an input bit-stream. In contrast, with the modulation technique of this invention, the 4-ary enumerative encoding algorithm operates on the succession of binary input bits forming the (O/E-interleaved) input bit-stream to Fibonacci encode the odd and even interleaves simultaneously as a single enumerative code with 4-ary output symbols. This single code will be referred to herein as an "interleaved Fibonacci code". In accordance with the principle of enumerative encoding discussed above, the 4-ary algorithm of the interleaved Fibonacci code thus maps M-bit words of the input bit-stream, according to value, to an ordered set of output codewords with 4-ary symbols. The 4-ary symbols are each represented by two parallel bits, and these are then interleaved for the succession of output symbols to produce a binary output stream with Fibonacci-encoded odd and even interleaves. The inherent properties of Fibonacci codes explained earlier provide an output bit-stream with global and interleaved run-length constraints. While applications might be envisaged where the constraint is required on the maximum run-length of 1's, bit-inversion results in a (G, I)-constraint suitable for the PRML codes discussed above.

It will be seen from the foregoing that, with the modulation technique of the present invention, a single 4-ary enumerative encoder is sufficient to generate both the odd and even interleaves of the output bit-stream as compared with the two encoders required by the prior art. In addition, no short block encoder is required. Furthermore, the modulation technique enables one to fully exploit all the codewords of the underlying generalized Fibonacci codes, and thus easily achieve the maximum possible length of the PRML (G, I) code. This results in the highest possible rate for the PRML code. In contrast, achieving this maximum length can be very difficult for the modulation encoder of U.S. Pat. No. 7,064,687 due to the difficulty in designing efficient Boolean logic for the short block code, particularly at rates above 13/14.

For applications such as PRML codes where the bits of the 4-ary output symbols are inverted, the inversion can of course be performed either before or after interleaving of the symbol bits.

In general, the Fibonacci codes encoded in the O/E interleaves of the output by the 4-ary algorithm may be different codes or the same code, though more usually the same code will be used. In any case, in preferred embodiments, the bases of the underlying Fibonacci code(s) have a limited span, allowing the encoding process to be performed in a sliding window fashion.

Figure 2:
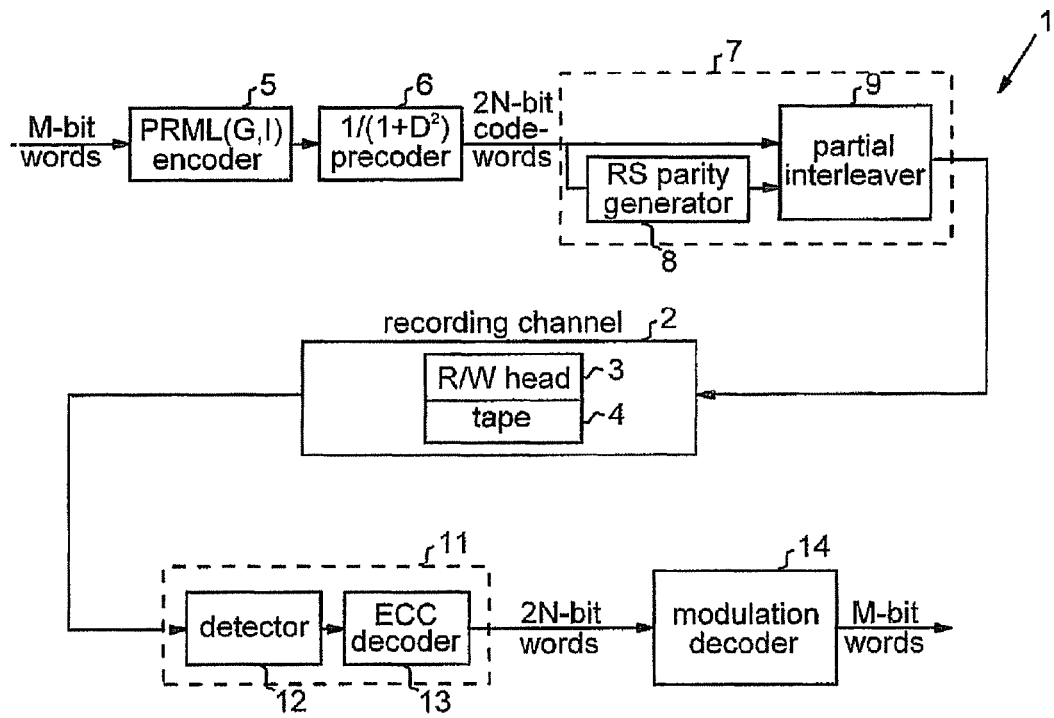
FIG. 2 is a schematic block diagram of a data storage system embodying the invention.

The block diagram of FIG. 2 is a schematic representation of a data storage system embodying the invention showing the main components involved in the recording/reproduction process. In this embodiment, the data storage system is a tape drive, indicated generally at 1, and thus has a recording channel 2 having a read/write head 3 for reading and writing to magnetic tape 4. On the recording side, the tape drive 1 has modulation coding apparatus in the form of a PRML (G, I) encoder 5, a precoder 6, and an ECC coder indicated generally at 7. ECC coder 7 consists of RS (Reed-Solomon) parity generator 8 and partial interleaver 9. On the reproduction side the drive 1 includes detector apparatus, indicated generally at 11 and comprising a detector 12 and an ECC decoder 13, together with a modulation decoder 14.

In operation, data to be recorded is supplied to PRML encoder 5 in the form of an input bit-stream comprising a succession of M-bit data words. The encoder 5 performs modulation coding of the input data as detailed below to produce a (G, I)-constrained encoded bit-stream comprising a succession of 2N-bit codewords. As usual in modulation systems based on PRML (G, I) codes, the encoded bit-stream is then subject to $1/(1+D^2)$ precoding by precoder 6, where "+" here signifies modulo-2 addition. In accordance with the reverse concatenation concept discussed earlier, ECC coding is performed after modulation coding in this embodiment. In this case, ECC coding involves partial interleaving of parity symbols in the codeword stream from precoder 6. Unconstrained RS parity symbols are generated in known manner from the 2N-bit codewords by parity generator 8. These symbols are then inserted at desired points in the encoded bit stream by partial interleaver 9. The resulting ECC-coded bit-stream is then recorded on tape 4 after the usual signal processing in channel 2. On reproduction, the reproduced signal obtained by reading tape 4 is supplied, after the usual reproduction signal processing, to detector 12. The detector 12 is typically a soft-input/hard output detector like the Viterbi detector, or a soft-input/soft output detector, which provides a likelihood measure for each recorded bit, and detects 2N-bit words in the reproduced signal in known manner. Parity checking and error correction processing is then performed in known manner by ECC decoder 13. The resulting succession of 2N-bit words is then supplied to modulation decoder 14 which operates as detailed below to produce a succession of M-bit words corresponding to the original input data.

Operation of the modulation encoder 5 and decoder 14 of tape drive 1 will now be described in detail with reference to FIGS. 3 and 4. While in principle these components could be implemented in software or a combination of hardware and software, in practice implementation in hardwired logic is preferred for simplicity and speed of operation. Suitable implementations will be apparent to those skilled in the art from the description herein.

Figure 3:
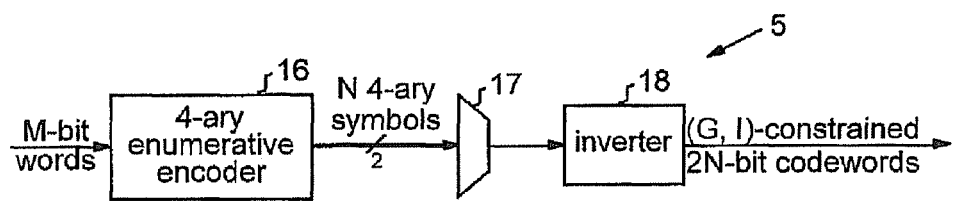
FIG. 3 is a block diagram of a modulation encoder of the FIG. 2 system.

As illustrated in FIG. 3, PRML (G, I) encoder 5 comprises a 4-ary enumerative encoder 16, a multiplexer 17 and an inverter 18. Briefly, encoder 16 applies a 4-ary enumerative encoding algorithm to the input bit-stream to implement an interleaved Fibonacci code as defined above. That is, the encoder 16 operates to simultaneously encode respective generalized Fibonacci codes in the odd and even interleaves of the input bit-stream as a single enumerative code with 4-ary output symbols. For each M-bit word in the input bit-stream, encoder 16 generates a succession of N 4-ary output symbols as indicated by the bold line in the figure. The 4-ary symbols are each represented by two bits. These bits are then interleaved by multiplexer 17 for the succession of 4-ary symbols to produce a binary output stream of 2N bits for each input M-bit word. Bit-inversion is then performed by inverter 18 so that the resulting modulation encoded bit-stream consists of a succession of 2N-bit codewords satisfying a (G, I) constraint as explained above.

In accordance with the principles of enumerative encoding, the 4-ary enumerative encoding algorithm implemented by encoder 16 maps input M-bit words directly to 4-ary codewords in dependence on the value of the input word. The 4-ary algorithm of this embodiment is applied in encoder 16 as an iterative process which produces one 4-ary symbol, represented by a binary output pair $(x^o_i, x^e_i)$, for each iteration step i. For an interleaved Fibonacci code IF to simultaneously encode two underlying Fibonacci codes each with N defined bases $\{w_n\}$, n=1 to N, the algorithm maps an input word $(u_{M-1}, u_{M-2}, \ldots, u_0)$ of value $u_{IF} = \Sigma u_k 2^k$, k=0 to M-1, to a 4-ary codeword $((x^o_1, x^e_1), (x^o_2, x^e_2), \ldots (x^o_N, x^e_N))$ in dependence on $u_{IF}$. In particular, given an input $u_{IF}$ in the range $$0 \leq u_{IF} < (w_{N+1})^2$$

the algorithm is as follows.

---

Initialization: $U^o = w_{N+1}$, $U^e = w_{N+1}$, $u = u_{IF}$.
For i=1 to N do {
   Compute partial lexicographic indices $v^o$, $v^e$ and partitioning indices $N^{00}$, $N^{01}$, $N^{10}$:
      $v^o = \min\{w_{N-i+1}, U^o\}$, $v^e = \min\{w_{N-i+1}, U^e\}$
      $N^{00} = v^o v^e$, $N^{01} = v^o U^e$, $N^{10} = N^{01} + (U^o - v^o) v^e$
   Compute time-i output $(x^o_i, x^e_i)$ and update input u:
      if $u < N^{00}$, then $x^o_i = 0$, $x^e_i = 0$
      else if $N^{00} \leq u < N^{01}$ then $x^o_i = 0$, $x^e_i = 1$, $u = u - N^{00}$
      else if $N^{01} \leq u < N^{10}$, then $x^o_i = 1$, $x^e_i = 0$, $u = u - N^{01}$
      else $x^o_i = 1$, $x^e_i = 1$, $u = u - N^{10}$
   Update upper bounds:
      $U^o = \min\{w_{N-i+1}, U^o - x^o_i w_{N-i+1}\}$,
      $U^e = \min\{w_{N-i+1}, U^e - x^e_i w_{N-i+1}\}$
}

---

Consideration of the above shows that the algorithm essentially involves initialising an input value u to the M-bit word value $u_{IF}$ and then, for each iteration i of i=1 to N, calculating values for the variables $N^{00}$, $N^{01}$, $N^{10}$ and generating an output symbol $(x^o_i, x^e_i)$ by comparing the input value u with $N^{00}$, $N^{01}$, $N^{10}$. The variables $N^{00}$, $N^{01}$, $N^{10}$ are referred to herein as "partitioning indices" since they serve to partition the range of possible input values u for each iteration into four sub-ranges:

$u < N^{00}$;

$N^{00} \leq u < N^{01}$;

$N^{01} \leq u < N^{10}$; and $u \geq N^{10}$.

For each iteration, the range of possible input values u is $0 \leq u < U^o U^e$, where $U^o$ and $U^e$ are the odd and even upper bounds at iteration i prior to the updating. Since the initial input value $u_{IF}$ is an M-bit word and since $0 \leq u_{IF} < 2^M \leq (w_{N-1})^2$, the partitioning indices for the first iteration i=1 partition the range of possible M-bit values into four. In more detail, the generation of an output symbol $(x^o_i, x^e_i)$ involves:

calculating the partitioning indices $N^{00}$, $N^{01}$, $N^{10}$;

comparing the current input value u to the partitioning indices to determine which of the four sub-ranges defined above contains that input value;

setting the two bits of $(x^o_i, x^e_i)$ according to which particular sub-range contains the input value; and updating the input value by subtracting from the current value of u the lower boundary value of the sub-range containing that value of u. (Here, the updated input value will be unchanged if u lies in the lowest sub-range since the lower boundary value is then zero).

The partitioning indices $N^{00}$, $N^{01}$, $N^{10}$ are calculated from first and second pairs of "partial lexicographic indices" $v^o$, $v^e$ and $U^o$, $U^e$. The indices $v^o$, $v^e$ are referred to hereinafter as lower partial lexicographic indices, and the upper bounds $U^o$, $U^e$ are referred to hereinafter as upper partial lexicographic indices. These value pairs are referred to as partial indices in that each value of the pair is associated with a respective one of the odd and even interleaves of the binary output stream from inverter 17, and hence, in effect, with one or other of the underlying Fibonacci codes in the interleaved Fibonacci code. As indicated in the above algorithm, the partial lexicographic indices of each pair $v^o$, $v^e$ and $U^o$, $U^e$ are dependent on respective Fibonacci bases selected in dependence on the iteration number i (that is, $w_{N-i+1}$). Note that, if the underlying Fibonacci codes are different, the appropriate base from one code will be used for calculating $v^o$, $U^o$, and the appropriate base from the other code will be used for $v^e$ and $U^e$. However, in preferred embodiments of encoder 16 the underlying Fibonacci codes are the same, and particularly preferred examples will be described below. Moreover, in preferred embodiments the underlying Fibonacci codes have bases with limited span L as defined earlier. In this case, the encoder 16 operates as a sliding window encoder of width 2L+2 as will be apparent to those skilled in the art.

Figure 4:
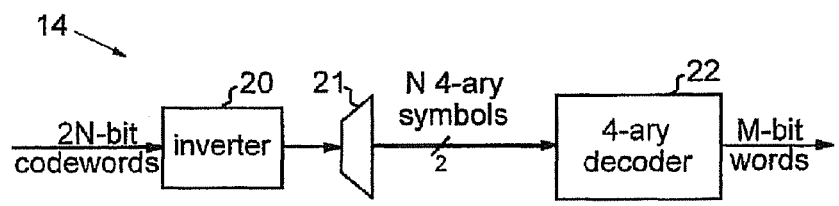
FIG. 4 is a block diagram of a modulation decoder of the FIG. 2 system.

FIG. 4 shows the modulation decoder 14 corresponding to PRML (G, I) encoder 5. As illustrated, the decoder 14 comprises an inverter 20, a demultiplexer 21 and 4-ary decoder 22. Inverter 20 receives the succession of 2N-bit words detected from the reproduced signal, and inverts the bits to provide a binary output stream to demultiplexer 21. This de-interleaves the odd and even bits of the received binary stream to produce a succession of N 4-ary output symbols $(x^o, x^e)$ for each detected 2N-bit word. Each group of N 4-ary symbols are then decoded by 4-ary decoder 22 to recover an output M-bit word corresponding to an M-bit word in the original steam of input data. 4-ary decoder 22 implements the inverse of the encoding algorithm applied by encoder 16, and thus applies a 4-ary enumerative decoding algorithm to simultaneously decode the underlying Fibonacci codes of the interleaved Fibonacci code applied by the 4-ary encoder. In successive iteration steps, the algorithm processes the pair of bits of successive 4-ary symbols $(x^o_i, x^e_i)$. In particular, given codewords $x^o_1, x^o_2, \ldots, x^o_N$, and $x^e_1, x^e_2, \ldots, x^e_N$ of the underlying Fibonacci codes in the odd and even interleaves, the algorithm is as follows.

---

Initialization: $U^o_N = w_{N+1}$, $U^e_N = w_{N+1}$, u=0
Pre-processing (Pre-compute and store all upper partial -continued

```
lexicographic indices):
For i=1 to N-1 do {
    U°_{N-i}=min{w_{N-i+1}, U°_{N-i+1} - x°_i w_{N-i+1}},
    U^e_{N-i}=min{w_{N-i+1}, U^e_{N-i+1} - x^e_i w_{N-i+1}}
}
For i=N down to 1 do {
    Compute lower partial lexicographic indices v°, v^e and partitioning
    indices N^{00}, N^{01}, N^{10}:
        v°=min{ w_{N-i+1}, U°_i }, v^e=min{ w_{N-i+1}, U^e_i }
        N^{00}= v°v^e, N^{01}= v° U^e_i, N^{10}= N^{01}+(U°_i-v°)v^e
    Update enumerative index (=decoder output) u:
        if (x°_i=0, x^e_i=0) then u=u
        else if (x°_i=0, x^e_i=1) then u=u+N^{00}
        else if (x°_i=1, x^e_i=0) then u=u+N^{01}
        else u=u+N^{10}
}
```

As before, the bases $w_{N-i+1}$ for the odd an even indices of pairs $v°$, $v^e$ an $U°_i$, $U^e_i$ can be different if the underlying Fibonacci codes differ, and the decoder operates as a sliding window decoder of width 2L+2 in the preferred case where the bases have limited span L.

The table of FIG. 5 gives an indication of the level of complexity of the 4-ary encoder operation as a breakdown of the numbers of different types of processing steps required per iteration. The critical complexity lies in the numbers of multiplications required. As indicated in the table, only three multiplications of (L+1)-bit numbers are required where the Fibonacci bases have limited span L. The complexity of the decoding algorithm is even less since there is no need for comparisons of (L+1)-bit numbers. In terms of storage requirements, where the underlying Fibonacci codes in the odd and even interleaves are identical with bases of span L, the 4-ary encoder need only store the N L-bit base elements. The decoder additionally needs to store 2N upper partial lexicographic indices which are L-bit numbers.

It will be appreciated that the 4-ary enumerative encoding techniques described above lead to highly efficient modulation encoding and decoding systems. These techniques allow all the codewords of the underlying generalized Fibonacci codes to be fully exploited, facilitating achievement of the maximum possible length of the PRML (G, I) code. This allows the highest possible rates to be achieved for the PRML codes. The resulting gains in code-rate support the use of partial interleaving of non-constrained symbols as in the RC scheme of FIG. 2. Moreover, the high-rate coding techniques lend themselves to use with ECC techniques based on LDPC (low-density parity-check) codes or turbo coding schemes which require message passing of soft information from the detector to the encoder. Particular examples of preferred PRML codes for embodiments of the invention will now be described with reference FIGS. 6 to 8.

Three rate (2N-P)/2N codes will be described (i.e. M=2N-P) in the following. In each case the two underlying Fibonacci codes in the interleaved Fibonacci code are the same. In the first code, P=1. The bases $w_n = B_n 2^{n-1}$, n=1, 2, N=118 for the underlying j=7 generalized Fibonacci code of span L=9 are defined by:

$B_n 2^9 = 512$ for n=1, 2, ..., 5

$B_n 2^9 = 496$ for n=6, 7, ..., 9

$B_n 2^9 = 505-n$ for n=10, 11, ..., 118.

These bases provide an interleaved Fibonacci code of length 236 and rate 235/236. The resulting PRML-code satisfies an I=7 and G=14 constraint within codewords and across codeword boundaries of concatenated codewords. This PRML code supports partial symbol interleaving of 8-bit RS parity bytes at any desired locations spaced by at least 16 bit positions. The insertion of such unconstrained bytes weakens the modulation constraints to I=11 and G=22. Any PRML-code obtained by using fewer than the N=118 base elements satisfies the same modulation constraints as the longer code, and shorter PRML-codes with the same constraints can be easily constructed, e.g. a rate-223/224 code.

In the second and third codes, P=3. By choosing code rates of this form, i.e. (2N-3)/2N, it was possible to design two very high rate codes of length 200 and 400 respectively. The first of these is a PRML(G=10, I=5) code of rate 197/200. This code is fully defined by the bases and j-profile of the underlying generalized Fibonacci code, with N=100 and j=5, set out in the table of FIG. 6. The second is a PRML(G=12I=6) code of rate 397/400. For this code, the bases of the underlying generalized Fibonacci code, with N=100 and j=6, are set out in the table of FIG. 7. The j-constraint profile of the underlying Fibonacci code is j(n)=6 within the codewords, i.e., for n=6, 7, ..., 199. At the boundaries, the following j-constraints apply:

at the left boundary: j(1)=1, j(2)=2, j(3)=3, j(4)=3, j(5)=4, j(6)=5;

at the right boundary: j(200)=3.

Thus, the j=6 constraint applies within codewords and across codeword boundaries. The resulting PRML code thus satisfies the constraints G=12 and I=6 within codewords and across codeword boundaries.

The three codes described above have the following characteristic properties as demonstrated by the comparison table of FIG. 8: the PRML(G=14,I=7) code has the highest rate but the weakest constraints; the PRML(G=10,I=5) code has the tightest constraints but the lowest rate; the PRML(G=12,I=6) code is a good compromise of the two other codes in that it has constraints of intermediate strength and achieves almost the rate of the PRML(14,7) code. All three codes support partial symbol interleaving of non-constrained parity symbols at any insertion locations which are sufficiently spaced.

While preferred embodiments of the invention have been described above, many changes and modifications can be made without departing from the scope of the invention.

The invention claimed is:

1. A method for modulation coding a stream of binary input data, the method comprising:
   applying a 4-ary enumerative encoding algorithm to the input bit-stream to produce a succession of 4-ary output symbols, the 4-ary algorithm being operative to simultaneously encode respective generalized Fibonacci codes in the odd and even interleaves of the input bit-stream; and
   interleaving bits of each successive 4-ary output symbol to produce an output bit-stream.

2. The method of claim 1, further comprising including inverting the bits of the 4-ary output symbols to produce a (G, I)-constrained output bit-stream.

3. The method of claim 1, wherein the 4-ary algorithm is operative to simultaneously encode the same Fibonacci code in the odd and even interleaves.

4. The method of claim 1, wherein the bases of each Fibonacci code have a limited span.

5. The method of claim 1, wherein an output bit-stream comprising a succession of 2N-bit codewords is produced from a succession of M-bit words in the input bit-stream, and wherein the 4-ary algorithm comprises, for each M-bit word, initialising an input value to the M-bit word value and then, for each iteration i of i=1 to N:

calculating partitioning indices for partitioning the range of possible input values into four sub-ranges;
comparing the input value to the partitioning indices to determine which sub-range contains the input value;
producing a 4-ary output symbol of value dependent on the sub-range containing the input value; and
updating the input value by subtracting the lower boundary value of the sub-range containing the input value.

6. The method of claim 5, wherein the partitioning indices are calculated from first and second pairs of partial lexicographic indices, the partial lexicographic indices of each pair being dependent on respective Fibonacci bases selected in dependence on the iteration number i.

7. The method of claim 5, wherein $M=2N-1$.

8. The method of claim 7, wherein $N=118$ and wherein the 4-ary algorithm is operative to encode the same generalized Fibonacci code in the odd and even interleaves, the generalized Fibonacci code having a $j=7$ constraint and having bases with limited span $L=9$ defined by:

$B_n 2^9 = 512$ for $n=1, 2, \ldots, 5$ $B_n 2^9 = 496$ for $n=6, 7, \ldots, 9$ $B_n 2^9 = 505-n$ for $n=10, 11, \ldots, 118$.

9. The method of claim 5, wherein $M=2N-3$.

10. The method of claim 9, wherein $N=100$ and wherein the 4-ary algorithm is operative to encode the same generalized Fibonacci code in the odd and even interleaves, the generalized Fibonacci code having a $j=5$ constraint and having bases with limited span $L=9$.

11. The method of claim 9, wherein $N=200$ and wherein the 4-ary algorithm is operative to encode the same generalized Fibonacci code in the odd and even interleaves, the generalized Fibonacci code having a $j=6$ constraint and having bases with limited span $L=9$.

12. A method for decoding an output bit-stream produced by a modulation coding method as claimed in any preceding claim, the method comprising:
de-interleaving bits of the output bit stream to produce a succession of 4-ary symbols; and
applying a 4-ary enumerative decoding algorithm to the 4-ary symbols to simultaneously decode said generalized Fibonacci codes applied to said odd and even interleaves by said 4-ary encoding algorithm, thereby to recover said stream of binary input data.

13. Apparatus for modulation coding a stream of binary input data, the apparatus comprising:
a 4-ary encoder for applying a 4-ary enumerative encoding algorithm to the input bit-stream to produce a succession of 4-ary output symbols, the 4-ary algorithm being operative to simultaneously encode respective generalized Fibonacci codes in the odd and even interleaves of the input bit-stream; and
a multiplexer for interleaving bits of each successive 4-ary output symbol to produce an output bit-stream.

14. The apparatus of claim 13, further comprising an inverter for inverting the bits of the 4-ary output symbols to produce a (G, I)-constrained output bit-stream.

15. The apparatus of claim 13, wherein the 4-ary encoder is adapted to simultaneously encode the same Fibonacci code in the odd and even interleaves.

16. The apparatus of claim 13, wherein the bases of each Fibonacci code have a limited span L and wherein the 4-ary encoder is adapted to operate as a sliding window encoder of width $2L+2$.

17. The apparatus of claim 13, wherein the 4-ary encoder is adapted to encode a succession of M-bit words in the input bit-stream such that the output bit-stream comprises a succession of 2N-bit codewords, the 4-ary encoder being adapted to apply a 4-ary algorithm which comprises, for each M-bit word, initialising an input value to the M-bit word value and then, for each iteration i of $i=1$ to N:
calculating partitioning indices for partitioning the range of possible input values into four sub-ranges;
comparing the input value to the partitioning indices to determine which sub-range contains the input value;
producing a 4-ary output symbol of value dependent on the sub-range containing the input value; and
updating the input value by subtracting the lower boundary value of the sub-range containing the input value.

18. The apparatus of claim 17, wherein the 4-ary encoder is adapted to calculate the partitioning indices from first and second pairs of partial lexicographic indices, the partial lexicographic indices of each pair being dependent on respective Fibonacci bases selected in dependence on the iteration number i.

19. The apparatus of claim 17, wherein $M=2N-1$.

20. The apparatus of claim 19, wherein $N=118$ and wherein the 4-ary encoder is adapted to encode the same generalized Fibonacci code in the odd and even interleaves, the generalized Fibonacci code having a $j=7$ constraint and having bases with limited span $L=9$ defined by:

$B_n 2^9 = 512$ for $n=1, 2, \ldots, 5$ $B_n 2^9 = 496$ for $n=6, 7, \ldots, 9$ $B_n 2^9 = 505-n$ for $n=10, 11, \ldots, 118$.

21. The apparatus of claim 13, wherein $M=2N-3$.

22. The apparatus of claim 21, wherein $N=100$ and wherein the 4-ary encoder is adapted to encode the same generalized Fibonacci code in the odd and even interleaves, the generalized Fibonacci code having a $j=5$ constraint and having bases with limited span $L=9$.

23. The apparatus of claim 21, wherein $N=200$ and wherein the 4-ary encoder (16) is adapted to encode the same generalized Fibonacci code in the odd and even interleaves, the generalized Fibonacci code having a $j=6$ constraint and having bases with limited span $L=9$.

24. Apparatus for decoding an output bit-stream produced by modulation coding apparatus as claimed in claim 13, the decoding apparatus comprising:
a demultiplexer for de-interleaving bits of the output bit stream to produce a succession of 4-ary symbols; and
a 4-ary decoder for applying a 4-ary enumerative decoding algorithm to the 4-ary symbols to simultaneously decode said generalized Fibonacci codes applied to said odd and even interleaves by said 4-ary encoding algorithm, thereby to recover said stream of binary input data.

25. A data storage system comprising:
modulation coding apparatus as in claim 13 for modulation coding a stream of binary input data comprising a succession of M-bit words to produce an output bit-stream comprising a succession of 2N-bit codewords;
a recording channel comprising a storage medium and a recording/reproduction mechanism for recording the succession of codewords on the storage medium and for reading the storage medium to generate a reproduced signal;
detector apparatus for detecting a succession of 2N-bit words in the reproduced signal;

a demultiplexer for de-interleaving bits of the detected 2N-bit words to produce a succession of 4-ary symbols; and a 4-ary decoder for applying a 4-ary enumerative decoding algorithm to the 4-ary symbols of each 2N-bit word to simultaneously decode said generalized Fibonacci codes applied to said odd and even interleaves by said 4-ary encoding algorithm, thereby to produce a succession of M-bit data words.

* * * * *